United States Patent [19]

Yang

[11] Patent Number: 5,317,284

[45] Date of Patent: May 31, 1994

[54] WIDE BAND, LOW NOISE, FINE STEP TUNING, PHASE LOCKED LOOP FREQUENCY SYNTHESIZER

[75] Inventor: Steve S. Yang, Chatsworth, Calif.

[73] Assignee: Hughes Aircraft Company, Los Angeles, Calif.

[21] Appl. No.: 15,957

[22] Filed: Feb. 8, 1993

[51] Int. Cl.$^5$ .............................................. H03L 7/00
[52] U.S. Cl. ......................................... 331/2; 331/11; 331/25
[58] Field of Search ...................... 331/2, 1, 11, 18, 25, 331/8; 328/14, 15; 364/701

[56] References Cited

U.S. PATENT DOCUMENTS

| | | | |
|---|---|---|---|
| 4,234,929 | 11/1980 | Riley, Jr. | 364/701 |
| 4,388,597 | 6/1983 | Bickley et al. | 331/2 |
| 4,420,723 | 12/1983 | De Jagger | 330/10 |
| 4,438,212 | 3/1984 | Malinkowski et al. | 331/2 |
| 4,839,603 | 6/1989 | Mower et al. | 331/2 |
| 4,912,432 | 3/1990 | Galani et al. | 331/2 |
| 4,912,433 | 3/1990 | Motegi et al. | 331/8 |
| 4,940,950 | 7/1990 | Helfrick | 331/2 |
| 4,943,787 | 7/1990 | Swapp | 331/2 |
| 4,944,762 | 2/1990 | Tay | 331/2 |
| 4,963,838 | 10/1990 | Hareyama | 331/2 |
| 4,965,533 | 10/1990 | Gilmore | 331/18 |
| 5,075,639 | 12/1991 | Taya | 331/2 |
| 5,105,168 | 4/1992 | Da Silva | 331/2 |
| 5,194,828 | 3/1993 | Kato et al. | 331/2 |
| 5,270,669 | 12/1993 | Jokura | 331/2 |

*Primary Examiner*—Raymond A. Nelli
*Attorney, Agent, or Firm*—Randall M. Heald; Charles D. Brown; Wanda K. Denson-Low

[57] ABSTRACT

A wide bandwidth, low noise, fine frequency step phase locked loop frequency synthesizer (10) and processing method. The synthesizer (10) includes a first divider (16) for dividing a first signal provided by a reference frequency source (12). A first phase locked loop (20) is provided for receiving a divided first signal from the first divider (16) and providing an intermediate frequency signal in response thereto. The first phase locked loop (20) includes a first phase detector (22) for comparing the phase of the first signal to the phase of a first feedback signal and providing a first phase difference signal in response thereto. The first phase locked loop (20) includes a first voltage controlled oscillator (30) for providing the intermediate signal in response to the first phase difference signal. The first phase locked loop (20) includes a first mixer (32) for mixing the intermediate signal with a second signal at a second frequency F2 and providing the first feedback signal in response thereto. A second divider (38) is included in the first phase locked loop (20) for dividing the first feedback signal prior to its application to the first phase detector (22). A third divider (39) is provided for shifting the frequency of the intermediate frequency signal, and a second phase locked loop (40) is coupled to the third divider for processing the frequency shifted intermediate frequency signal and providing an output frequency signal from the synthesizer. The second phase locked loop (40) includes a second phase detector (42) for comparing the phase of the shifted intermediate signal to the phase of a second feedback signal and providing a second phase difference signal in response thereto. A second voltage controlled oscillator (50) is included for providing the output frequency signal from the synthesizer (10).

20 Claims, 1 Drawing Sheet

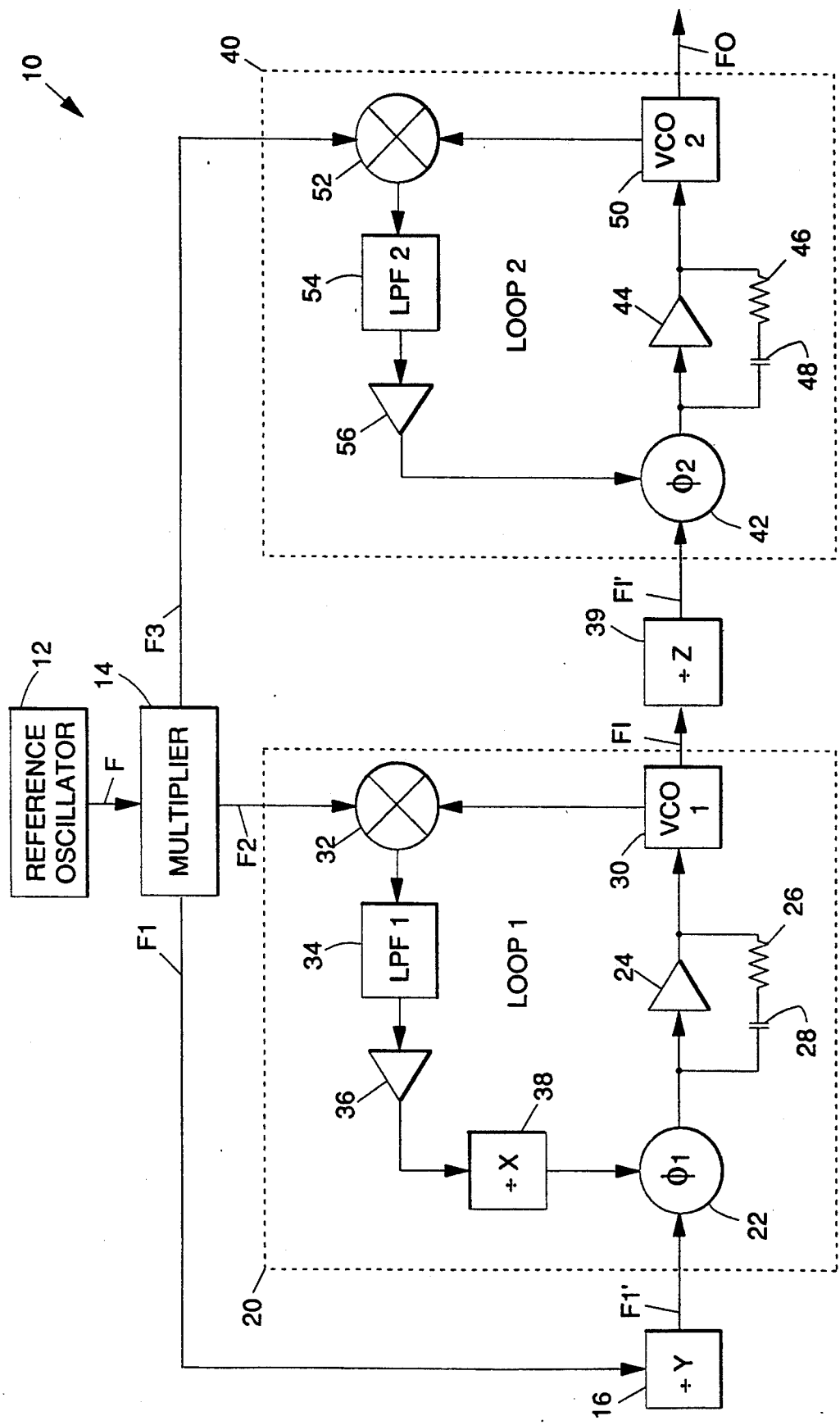

WIDE BAND, LOW NOISE, FINE STEP TUNING, PHASE LOCKED LOOP FREQUENCY SYNTHESIZER

BACKGROUND

The present invention relates generally to frequency synthesizers and synthesizing methods, and more particularly, to a wide bandwidth, low noise, fine frequency step phase locked loop frequency synthesizer and synthesizing method that provides for a large number of frequency steps.

Frequency synthesizers are used to generate reference frequencies for radar systems, communication systems, test instruments and numerous other devices. In many of these applications, there is a need for low phase noise and frequency agility. In general, frequency synthesizers include a signal source, a frequency multiplier or divider and a phase locked loop. The signal source (typically a crystal oscillator) provides a signal at a reference frequency. The frequency multiplier or divider uses this signal to synthesize a signal at a frequency of interest. The phase locked loop synchronizes the signal at the frequency of interest with an input signal.

Noise around a signal may be represented as fluctuations of either the amplitude or phase of the carrier. This noise is commonly referred to as phase noise, since fluctuations in phase are typically the dominant source of noise close to the carrier. Phase noise causes lower receiver sensitivity in multi-signal environments, clutter noise in Doppler radar systems, and phase errors in digital communication systems. Phase noise imposes fundamental limitations wherever a weak signal is processed in the presence of a strong interfering signals. In receivers, phase noise sidebands of the receiver local oscillator are transferred to the IF product of the strong interfering signal and cover up the weak wanted signals. In a Doppler radar system, the strong interfering signal is produced by reflections from large stationary objects. Phase noise side bands of this unwanted return signal are decorrelated by delay and potentially cover the weak Doppler signal in the form of clutter noise. Phase noise is also a limiting factor in digital data transmission systems. Phase noise adds to overall system noise increasing the bit error rate and may cause a cycle slip in carrier or data clock recovery.

Conventional phase locked loop frequency synthesizers exhibit better frequency agility using higher reference frequencies. This is due to the fact that phase locked loops generally require several cycles to acquire (lock) onto a signal. At higher frequencies, more cycles are available in a shorter period of time.

In conventional systems, the phase locked synthesized frequency provided by a frequency synthesizer either has many fine steps with high phase noise or has low phase noise with very limited tuning step size. More specifically, the patents listed below disclose conventional synthesizers that cannot provide both low phase noise and synthesized frequencies having many fine steps at the same time. None of these conventional systems provides both low phase noise and synthesized frequencies having many fine steps at the same time.

The prior art patents referred to above are identified as follows: U.S. Pat. No. 4,940,950 entitled "Frequency Synthesis Method and Apparatus Using Approximation to Provide Closely Spaced Discrete Frequencies Over a Wide Range with Rapid Acquisition," issued to Helfrick, U.S. Pat. No. 4,965,533 entitled "Direct Digital Synthesizer Driven Phase Lock Loop Frequency Synthesizer," issued to Gilmore, U.S. Pat. No. 4,912,433 entitled "VCO Controlled by Separate Phase Locked Loop," issued to Motegi et al., U.S. Pat. No. 4,234,929 entitled "Control Device for a Phase Lock Loop Vernier Frequency Synthesizer," issued to Riley, Jr., U.S. Pat. No. 4,388,597 entitled "Frequency Synthesizer Having Plural Phase Locked Loops," issued to Bickley et al., and U.S. Pat. No. 4,912,432 entitled "Plural Feedback Loop Digital Frequency Synthesizer," issued to Galani et al. Of these references, the Bickley et al. and Galani et al. patents disclose plural phase locked loop synthesizers, and are considered pertinent to the present invention.

The Bickley et al. patent employs three phase locked loops to achieve synthesis. The synthesizer includes a first phase locked loop comprising a mixer and a phase detector. A second phase locked loop having a programmable divider supplies a reference frequency in predetermined steps to the mixer, while a third phase locked loop provides a reference frequency in predetermined steps to the phase detector, which steps are different from the steps provided by the second phase locked loop. Also, in a preferred embodiment, a fourth phase locked loop provides a reference signal to a mixer in the third phase locked loop to reduce the operating frequency therein and the output of the fourth phase locked loop is mixed with an output from the first phase locked loop to extend the range of the synthesizer.

The Galani et al. patent discloses an indirect digital frequency synthesizer adapted to produce a signal having a selected one of a plurality of relatively closely spaced frequencies and having a relatively fast frequency switching time. Multiple feedback loops are fed by reference frequency signals whose frequency is greater than the desired frequency separation provided by the synthesizer. The bandwidth of each of the feedback loops is less than the frequency of the reference fed to each loop, and achievement of frequency separation less than the frequency of either of the reference frequencies enables each of the feedback loops to have increased bandwidth and therefore reduced frequency switching times and increased noise suppression.

In order to advance the state of the art as evidenced in the above-cited patents, U.S. Pat. No. 5,150,078 entitled "Low Noise, Fine Frequency Step Synthesizer" issued to Steven S. Yang, et al. and assigned to the assignee of the present invention, discloses a frequency synthesizer that achieves low phase noise and provides for synthesized frequencies having many fine steps, and provides a low phase noise frequency synthesizer with fine frequency step tuning. This synthesizer provides for half-integer digital frequency dividing, VCO frequency offsetting, and local oscillator harmonic mixing using two phase locked loop circuits. The first loop generates the required frequency steps, while in the second loop the signal is divided by a fixed number to reduce both the frequency step size and to reduce the phase noise. The second loop output is divided by two, and then mixed with the third harmonic of the reference frequency to generate an offset frequency that is locked to the low phase noise frequency of the first loop. The present invention is an improvement to this synthesizer that provides for wide-band frequency operation.

In view of the above, there is a need in the art for a frequency synthesizer and synthesizing method that exhibits good frequency agility and low phase noise, and provides many channels, thus permitting wide band operation.

SUMMARY OF THE INVENTION

The present invention is a wide bandwidth, low noise, fine frequency step tuning, phase locked loop frequency synthesizer that exhibits good frequency agility and low phase noise. The present synthesizer comprises a sequential phase locked loop architecture that employs three digitally programmable frequency dividers in conjunction with sequential phase locked loops.

The present synthesizer includes a reference frequency source and a multiplier for producing a plurality of related reference signals having reference frequencies F1, F2, F3. The synthesizer includes a first frequency shifter (divider) that is adapted to shift the frequency of a first reference signal F1 to a frequency F1'. A first phase locked loop is adapted to process the frequency shifted first reference signal at frequency F1' and a second reference signal to provide an intermediate frequency signal at frequency FI in response thereto. The intermediate frequency signal FI is processed by a second frequency shifter (divider) that is adapted to shift the frequency of the intermediate frequency signal to a frequency FI'. The shifted intermediate frequency signal is coupled to a second phase locked loop. The second phase locked loop processes the frequency shifted intermediate signal FI' and a third reference signal and provides an output frequency signal of the synthesizer at a frequency FO in response thereto.

The first phase locked loop includes a first phase detector for comparing the phase of the first reference signal to the phase of a first feedback signal, and for providing a first phase reference signal in response thereto. A first voltage controlled oscillator is coupled to the first phase detector for providing the intermediate signal in response to the first phase reference signal. A first mixer is coupled to the first voltage controlled oscillator and is adapted to mix the intermediate signal with the second reference signal to provide the first feedback signal in response thereto. A third frequency shifter (divider) is coupled between the first mixer and the first phase detector for shifting the frequency of the first feedback signal before it is applied to the first phase detector.

The second phase locked loop includes a second phase detector for comparing the phase of the shifted intermediate signal to the phase of a second feedback signal and for providing a second phase reference signal in response thereto. A second voltage controlled oscillator is coupled to the second phase detector for providing an output signal in response to the second phase reference signal. A second mixer is coupled to the second voltage controlled oscillator and is adapted to mix the output signal with the third reference signal and provide the second feedback signal in response thereto.

The present invention also provides for a method of synthesizing frequencies. One such method comprises the following steps. Providing a plurality of reference frequency signals. Frequency dividing a first reference frequency signal by a first predetermined number. Processing the frequency divided first reference frequency signal and a second reference frequency signal to generate an intermediate frequency signal at frequency FI. Frequency dividing the intermediate frequency signal by a second predetermined number. Processing the frequency divided intermediate frequency signal and a third reference frequency signal to generate an output frequency signal.

BRIEF DESCRIPTION OF THE DRAWINGS

The various features and advantages of the present invention may be more readily understood with reference to the following detailed description taken in conjunction with the accompanying drawing, and in which the sole drawing figure is illustrative of a wide bandwidth, low noise, fine frequency step phase locked loop frequency synthesizer and processing method in accordance with the principles of the present invention.

DETAILED DESCRIPTION

Referring to the drawing figure, it is a block diagram of an illustrative implementation of a wide bandwidth, low noise, fine frequency step phase locked loop frequency synthesizer 10 of the present invention. The synthesizer 10 includes a crystal oscillator 12, or reference oscillator 12, which provides a reference frequency signal (F) at a predetermined source frequency. The characteristics of the reference oscillator 12 are important because the phase noise of an output signal (FO) from the synthesizer 10 depends upon and is derived from it. The source frequency provided by the reference oscillator 12 requires good short term frequency stability with very low AM and phase noises. The reference oscillator 12 is typically a commercially available circuit using either a very high Q-factor overtone crystal or using a surface acoustic wave (SAW) resonator.

The output of the crystal oscillator 12 is coupled to a conventional frequency multiplier circuit 14. In the illustrative embodiment, the frequency multiplier circuit 14 provides several reference frequency signals at multiples of the source frequency provided by the crystal oscillator 12, and which are identified as F1, F2 and F3. A first reference frequency signal at a primary reference frequency F1 is coupled to a first programmable divider circuit 16 (divide by "Y") that comprises a first frequency shifting circuit. The first programmable divider circuit 16 may be implemented using a digital programmable divider in a manner well-known to those skilled in the art. The first programmable divider circuit 16 is adapted to divide or shift the frequency of the first reference frequency signal to provide a shifted signal at frequency F1'.

The frequency synthesizer 10 includes first and second sequential phase locked loops 20, 40. The first phase locked loop 20 includes a first phase detector 22 which has an input derived from the first programmable divider circuit 16, and which processes the shifted signal at frequency F1'. The output of first phase detector 22 is coupled to a first video amplifier 24. The first video amplifier 24 has a feedback loop comprising a first feedback resistor 26 and a first feedback capacitor 28 for filtering the output of the first video amplifier 24.

The output of the first video amplifier 24 is coupled to a first voltage controlled oscillator 30. The output of the first voltage controlled oscillator 24 is fed back to the phase detector 22 by means of a first feedback path. The first feedback path includes a first mixer 32, a first loop filter 34 (low pass filter), a first loop amplifier 36, and a second programmable divider circuit 38 (divide by "X") that comprises a second frequency shifting circuit. The second programmable divider circuit 38 may be implemented using a digital programmable divider that operates as a step frequency generator. The first mixer 32 is adapted to mix the output of the first voltage controlled oscillator 30 with a second reference signal at a second frequency F2 provided by the multiplier 14. The output of the mixer 32 is low pass filtered by the first loop filter 34 and applied to the first loop amplifier 36. The output of the first loop amplifier 36 is coupled to the first phase detector 22 through the second programmable divider circuit 38.

The output of the first phase locked loop 20 comprises an intermediate frequency signal (FI) that is provided by the first voltage controlled oscillator 30 and which is coupled to the second phase locked loop 40 through a third programmable divider circuit 39 (divide by "Z") that comprises a third frequency shifting circuit. The third programmable divider circuit 39 may be implemented using a digital programmable divider that operates as a step frequency generator. The third programmable divider circuit 39 is adapted to divide or shift the frequency of the intermediate frequency signal (FI) to provide a shifted intermediate frequency signal at frequency FI'.

The second phase locked loop 40 includes a second phase detector 42 which has an input derived from the third programmable divider circuit 39. The output of second phase detector 42 is coupled to a second video amplifier 44. The second video amplifier 44 has a feedback loop comprising a second feedback resistor 46 and a second feedback capacitor 48 for filtering the output of second video amplifier 44.

The output of the second video amplifier 44 is coupled to a second voltage controlled oscillator 50. The output of the second voltage controlled oscillator 50 is fed back to the second phase detector 42 by means of a second feedback path. The second feedback path includes a second mixer 52, a second loop filter 54 (loss pass filter), and a second loop amplifier 56. The second mixer 52 is adapted to mix the output of the second voltage controlled oscillator 50 with a third reference frequency signal at frequency F3 (translation offset frequency F3) provided by the multiplier 14. The output of the second mixer 52 is filtered by the second loop filter 54 and coupled to second loop amplifier 56. The output of the second loop amplifier 56 is coupled to a second input of the second phase detector 42. The output of the second voltage controlled oscillator 50 comprises an output frequency signal FO of the frequency synthesizer 10.

In operation, the frequency of the first phase locked loop 20 is set by the first voltage controlled oscillator 30. The frequency of the first phase locked loop 20 is offset by the second reference frequency signal at frequency F2 in the first mixer 32. The first loop filter 34 removes unwanted components of the output signal provided by the first mixer 32. The filtered output signal is amplified by the first loop amplifier 36 and is applied to the second programmable divider circuit 38. The second divider circuit 38 divides the frequency of the feedback signal as appropriate for a desired channel. The first phase detector 22 compares the phase of the divided feedback signal with an assigned reference frequency signal derived from the first divider circuit 16. An output voltage representing the phase difference between these two inputs is amplified by the first video amplifier 24, and is applied to the first voltage controlled oscillator 30. This amplified voltage is used to adjust and control the frequency of the first voltage controlled oscillator 30 and thereby lock the first phase locked loop 20 to the assigned frequency of a particular channel.

After the frequency of the first voltage controlled oscillator 30 is locked to the assigned channel, the third divider circuit 39 lowers the frequency, channel spacing and phase noise without affecting tuning agility. The frequency reduced signal provided by the third divider circuit 39 is applied to the second phase locked loop 40 to be translated to provide the desired output frequency of the output frequency signal FO.

The operation of the second phase locked loop 40 is similar to the operation of the first phase locked loop 20. The frequency of the signal provided by the second voltage controlled oscillator 50 is offset by the translation offset frequency F3 in the second mixer 52. The signal provided by the second mixer 52 is filtered and amplified, and is applied to the second phase detector 42. The second phase detector 42 compares the amplified and filtered feedback signal derived from the second feedback path to the signal provided by the first phase locked loop 20 from the third divider circuit 39. The output of the second phase detector 42 is amplified and filtered by the second video amplifier 44 and its feedback path to control the frequency of the second voltage controlled oscillator 50. The output of the second voltage controlled oscillator 50 is the system output frequency signal at frequency FO, which is determined from the following equations:

$$FO = F3 \pm (F2 \pm XF1/Y)/Z \qquad [1]$$

$$\text{or } FO = F3 \pm F2/Z \pm X(F1/YZ) \qquad [2]$$

where F1 is the primary reference frequency of the first phase locked loop 20; F2 is the offset frequency of the first phase locked loop 20; F3 is the translation offset frequency of the second phase locked loop 40; FO is the output frequency of the synthesizer 10; X is the divisor of the second divider circuit 38; Y is the divisor of the first divider circuit 16; and Z is the divisor of the third divider circuit 39.

From equation [2], it should be appreciated that the present invention allows for the creation of a batch of frequencies by fixing the Y and Z divisors and varying the X divisor. The output frequency FO vary with a frequency increment of F1/YZ. The number of channels in the batch depends upon the size of X. Likewise, batches of frequencies may be created by varying the divisor Z for each value of the divisor X. Furthermore, if the YZ product is constant for every value of X, each batch of frequencies have the same channel frequency increment. Since the divisor Z is variable, the synthesizer 10 can generate many batches of frequency channels, some of which may overlap. If the batches of frequency channels are chosen to be very close to each other with a small value of X, a close frequency spacing is provided. Hence, continuous channels may be generated with very low phase noise. To appreciate the noise reduction capability of the present synthesizer 10, in a conventional phase locked loop synthesizer, the phase noise of its voltage controlled oscillator is increased in proportion to the loop divider number.

The third divider circuit 39 is provided to reduce phase noise generated by the second divider circuit 38. For example, if the maximum dividing number (X) of the second divider circuit 38 is 100, the maximum phase noise of the first voltage controlled oscillator 30 is 20 log 100=40 db above its reference signal (F1/Y). On the other hand, if the output frequency of the first phase locked loop 20 is divided by divisor Z in the third divider circuit 39, it reduces the phase noise of the first phase locked loop 20 by a factor of 20 log 20=26 db. Thus, overall, the phase noise increase is 14 db, which is equivalent to the loop divisor X divided by the value five (5).

If the synthesizer 10 requires additional phase noise reduction, the reference frequency may be increased and the divisor Z may be increased to achieve the desired degree of noise reduction. In addition, since phase locked loops more rapidly acquire higher frequency signals than lower frequency signals, and since the reference frequency is Z times higher than the channel increment frequency, the frequency acquisition time is Z times faster than for a synthesizer directly locking to the increment frequency as a reference.

Referring again to equation [2], the output frequency FO is translated by the offset frequency F3 to a desired frequency band. The second term F2/Z determines the frequency at which every new value of Z will allow for the generation of a new batch of channels. The last term X(F1/YZ) is the channel increment frequency spacing and X is the increment number.

The following is a design example providing a low phase noise frequency synthesizer 10 in accordance with the present teachings with 100 kilohertz (khz) channel frequency increment spacing consecutively over a bandwidth of more than 75 MHz in any desired frequency band. In this example, the frequency increment spacing F1/YZ is 100 khz regardless of the value of Z. To satisfy this requirement, the YZ product is selected as follows: YZ=2×2×2×3×3×3×5×7=7560.

Some of these factors are grouped as Z and the rest of them are grouped as Y. In this manner, Z and Y multiplied together yield a constant, in this case 7560. The group in the illustrative synthesizer 10 are (420, 18), (378, 20), (360, 21), (315, 24), (280, 27), (252, 30), (210, 36), (168, 45), (140, 54), (108, 70), and (90, 84). Many other groups may also be selected. Since the value of YZ has been determined, the reference frequency F1=100 khz×XY=756 MHz. To eliminate the need for multiple reference oscillators, F2=2F1=1512 MHz.

Once the frequencies F1 and F2 and the values of the X and Y divisors have been determined, a detailed frequency table may be generated as shown below to verify channel continuity, phase noise and tuning agility.

| | I | II | III | IV | V | | VI F2/Z + X(F1/YZ) | |
|---|---|---|---|---|---|---|---|---|
| | | | | | X | | | |
| | Y | Z | F1/Y | F2/Z | MAX | MIN | MAX | MIN |
| 1 | 420 | 18 | 1.8 | 84 | 90 | 30 | 93 | 87 |
| 2 | 387 | 20 | 2.0 | 75.6 | 114 | 30 | 87 | 78.6 |
| 3 | 360 | 21 | 2.1 | 72 | 66 | 30 | 78.6 | 75 |
| 4 | 315 | 24 | 2.4 | 63 | 120 | 30 | 75 | 66 |
| 5 | 280 | 27 | 2.7 | 56 | 100 | 30 | 66 | 59 |
| 6 | 252 | 30 | 3.0 | 50.4 | 86 | 30 | 59 | 53.4 |
| 7 | 210 | 36 | 3.6 | 42 | 114 | 30 | 53.4 | 45 |
| 8 | 168 | 45 | 4.5 | 33.6 | 114 | 30 | 45 | 36.6 |
| 9 | 140 | 54 | 5.4 | 28 | 86 | 30 | 36.6 | 31 |
| 10 | 108 | 70 | 7.0 | 21.6 | 94 | 30 | 31 | 24.6 |
| 11 | 90 | 84 | 8.4 | 18 | 66 | 30 | 24.6 | 21 |
| 12 | 70 | 108 | 10.8 | 14 | 70 | 30 | 21 | 17 |

Column I in the table shows the Y divisor, and column II shows the Z divisor. Frequencies in columns III, IV, V and VI are in MHz. In the same row, the product of these divisors is 7560 to maintain the system channel frequency increment at 100 khz. Column III shows the reference frequencies of the first phase locked loop 20 to which each of the batch of frequencies lock. The frequencies of this synthesizer 10 are from 1.8 MHz to 10.8 MHz depending on the combination of the Y and Z divisors. Those frequencies determine the channel acquisition time and are much higher than the 100 khz channel increment frequency.

Column IV indicates the batch offset frequencies which are determined by the dividing numbers of the divisor Z. There are 12 different batch offset frequencies in this example. Column V shows the minimum and maximum dividing numbers for X in the first phase locked loop 20 at each batch of frequencies which are used to determine the maximum and minimum dividing number of each batch. These values can also be used to calculate the maximum phase noise of each batch by dividing numbers of X divided by the dividing numbers of Z in the same row. Column VI shows the maximum frequency and minimum frequency of each batch. These numbers may also be used for checking the continuity of the channels. In the table, 12 different batches of frequencies with different combinations of dividing numbers of Y and Z are provided. The total of 760 channels are provided in 100 khz frequency consecutive increments.

The worse noise channel is at the second batch which is (20 log 114−20 log 20)=15.2 db above the reference frequency 2 MHz. The worse acquisition time is at the first batch which has to lock to the 1.8 MHz. Next, after the frequency channels in the first phase locked loop 20 are generated the frequencies are translated to the desired frequency band in the second phase locked loop 40 by the reference frequency F3, then the design of the synthesizer 10 is complete.

Thus, using three digital programmable dividers 16, 38, 39 in sequential phase locked loops 20, 40, batches of agile tuning small frequency increment channels are generated with very low phase noise. Long sequential low phase noise channels with equal frequency increments may be bridged together with carefully selected Y and Z divisors to provide batches of closely aligned frequency channels. The frequency channels are bridged together in sequence with a few small numbers of X. After the sequential and equal spacing frequency channels are generated in the first phase locked loop 20, they may be translated to any frequency band.

From the above, it should be apparent that the present invention also contemplates a processing method for synthesizing frequencies. One such method comprises the following steps. Providing a plurality of reference frequency signals. Frequency dividing a first reference frequency signal by a first predetermined number. Processing the frequency divided first reference frequency signal and a second reference frequency signal to generate an intermediate frequency signal at frequency. Frequency dividing the intermediate frequency signal by a second predetermined number. Processing the frequency divided intermediate frequency signal and a third reference frequency signal to generate an output frequency signal.

The first processing step comprises mixing the intermediate frequency signal with the second reference frequency signal to provide a first feedback signal in response thereto; frequency dividing the first feedback signal; comparing the phase of the frequency divided first reference frequency signal to the phase of the frequency divided first feedback signal and providing a first phase difference signal in response thereto; and generating the intermediate frequency signal in response to the first phase difference signal. The second processing step comprises frequency dividing the intermediate frequency signal; mixing the output frequency signal with the third reference frequency signal to provide a second feedback signal in response thereto; comparing the phase of the second reference frequency signal to the phase of the frequency divided intermediate frequency signal and providing a second phase difference signal in response thereto; and generating the output frequency signal in response to the second phase difference signal.

Thus there has been described a new and improved wide bandwidth, low noise, fine frequency step phase locked loop frequency synthesizer. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Apparatus comprising:
   reference frequency means for providing a plurality of reference frequency signals having predetermined reference frequencies F1, F2, F3;
   first frequency shifting means coupled to the reference frequency means for shifting the frequency of the first frequency signal at frequency F1 to provide a frequency shifted reference frequency signal at frequency F1';
   first phase locked loop means coupled to the reference frequency means for receiving the frequency shifted reference frequency signal at frequency F1' and the second reference frequency signal at frequency F2, and for providing an intermediate output signal at frequency FI in response thereto;
   second frequency shifting means coupled to the first phase locked loop means for shifting the frequency of the intermediate frequency signal at frequency FI to provide a frequency shifted intermediate frequency signal at frequency FI'; and
   second phase locked loop means coupled to the reference frequency means and to the second frequency shifting means for receiving the third reference frequency signal at frequency F3 and the frequency shifted intermediate signal at frequency FI' and for providing an output signal of the frequency synthesizer at frequency FO in response thereto.

2. The apparatus of claim 1 wherein the first phase locked loop means comprises:
   first voltage controlled oscillator means for providing the frequency shifted intermediate signal FI in response to a first phase difference signal;
   first mixing means coupled to the first voltage controlled oscillator means and to the reference frequency means for mixing the intermediate frequency signal with the second reference frequency signal at frequency F2 and for providing a first feedback signal in response thereto;
   third frequency shifting means coupled to the first mixing means for shifting the frequency of the first feedback signal to provide a frequency shifted first feedback signal; and
   first phase detector means coupled to the first and third frequency shifting means for comparing the phase of the frequency shifted reference frequency signal at frequency F1' to the phase of the frequency shifted first feedback signal and for providing the first phase difference signal in response thereto.

3. The apparatus of claim 2 wherein the first, second and third frequency shifting means each comprise a programmable divider.

4. The apparatus of claim 2 wherein the first phase locked loop means further comprises first video amplifier means coupled between the first phase detector means and the first voltage controlled oscillator means for amplifying the first phase difference signal.

5. The apparatus of claim 4 wherein the first video amplifier means further comprises first filter means for filtering the first phase difference signal.

6. The apparatus of claim 2 wherein the first phase locked loop means comprises first loop filter means coupled between the first mixing means and the third frequency shifting means for filtering the first feedback signal.

7. The apparatus of claim 6 further comprising first loop amplifier means coupled between the first mixing means and the third frequency shifting means for amplifying the first feedback signal.

8. The apparatus of claim 2 wherein the second phase locked loop means comprises:
   second voltage controlled oscillator means for providing the output signal in response to a second phase difference signal;
   second mixing means coupled to the second voltage controlled oscillator means and to the reference frequency means for mixing the output signal with the third reference frequency signal at frequency F3 and for providing a second feedback signal in response thereto; and
   second phase detector means coupled to the second frequency shifting means and the second mixing means for comparing the phase of the frequency shifted intermediate frequency signal at frequency FI' to the phase of the second feedback signal and for providing the second phase difference signal in response thereto.

9. The apparatus of claim 8 wherein the second phase locked loop means further comprises second video amplifier means coupled between the second phase detector means and the second voltage controlled oscillator means for amplifying the second phase difference signal.

10. The apparatus of claim 9 wherein the second video amplifier means further comprises second filter means for filtering the second phase difference signal.

11. The apparatus of claim 8 wherein the second phase locked loop means comprises second loop filter means coupled between the second mixing means and the second phase detector means for filtering the second feedback signal.

12. The apparatus of claim 11 further comprising second loop amplifier means coupled between the second mixing means and the second phase detector means for amplifying the second feedback signal.

13. A frequency synthesizer comprising:
   a reference frequency source for providing a plurality of reference frequency signals;
   first divider means coupled to the reference frequency source for dividing a first reference frequency signal at a first frequency provided thereby;

first phase locked loop means coupled to the first divider means for receiving the divided first reference frequency signal and for providing an intermediate frequency signal in response thereto, and wherein the first phase locked loop means comprises:

first phase detector means coupled to the first divider means for comparing the phase of the first reference frequency signal to the phase of a first feedback signal and for providing a first phase difference signal in response thereto;

first voltage controlled oscillator means coupled to the first phase detector means for providing the intermediate signal in response to the first phase difference signal;

first mixing means coupled to the first voltage controlled oscillator means and the reference frequency source for mixing the intermediate signal with a second signal at a second frequency provided by the reference frequency source and for providing the first feedback signal in response thereto; and second divider means coupled between the first mixing means and the first phase detector means for frequency shifting the first feedback signal to provide a frequency shifted first feedback signal;

third divider means coupled to the first voltage controlled oscillator means for shifting the frequency of the intermediate signal to provide a frequency shifted intermediate signal; and second phase locked loop means for receiving the frequency shifted intermediate signal and for providing an output signal of the frequency synthesizer in response thereto, and wherein the second phase locked loop means comprises:

second phase detector means coupled to the third divider means for comparing the phase of the frequency shifted intermediate signal to the phase of a second feedback signal and for providing a second phase difference signal in response thereto;

second voltage controlled oscillator means coupled to the second phase detector means for providing the output signal of the frequency synthesizer in response to the second phase difference signal; and second mixing means coupled to the reference frequency source, the second voltage controlled oscillator means, and the second phase detector means, for mixing the output signal with a third signal at a third frequency provided by the reference frequency source, and for providing the second feedback signal in response thereto.

14. The frequency synthesizer of claim 13 wherein the first phase locked loop means further comprises first video amplifier means and first filter means coupled between the first phase detector means and the first voltage controlled oscillator means for amplifying and filtering the first phase difference signal.

15. The frequency synthesizer of claim 14 wherein the first phase locked loop means comprises:

first loop filter means coupled between the first mixing means and the third frequency shifting means for filtering the first feedback signal; and first loop amplifier means coupled between the first loop filter means and the third divider means for amplifying the first feedback signal.

16. The apparatus of claim 13 wherein the second phase locked loop means further comprises second video amplifier means and second filter means coupled between the second phase detector means and the second voltage controlled oscillator means for amplifying and filtering the second phase difference signal.

17. The apparatus of claim 16 wherein the second phase locked loop means comprises:

second loop filter means coupled between the second mixing means and the second phase detector means for filtering the second feedback signal; and second loop amplifier means coupled between the second mixing means and the second phase detector means for amplifying the second feedback signal.

18. A method of synthesizing frequencies comprising the steps of:

providing a plurality of reference frequency signals;

frequency dividing a first reference frequency signal by a first predetermined number;

processing the frequency divided first reference frequency signal and a second reference frequency signal to generate an intermediate frequency signal at frequency;

frequency dividing the intermediate frequency signal by a second predetermined number; and processing the frequency divided intermediate frequency signal and a third reference frequency signal to generate an output frequency signal.

19. The method of claim 18 wherein the first processing step comprises the steps of:

mixing the intermediate frequency signal with the second reference frequency signal to provide a first feedback signal in response thereto;

frequency dividing the first feedback signal;

comparing the phase of the frequency divided first reference frequency signal to the phase of the frequency divided first feedback signal and providing a first phase difference signal in response thereto; and generating the intermediate frequency signal in response to the first phase difference signal;

and wherein the second processing step comprises the steps of:

frequency dividing the intermediate frequency signal;

mixing the output frequency signal with the third reference frequency signal to provide a second feedback signal in response thereto;

comparing the phase of the second reference frequency signal to the phase of the frequency divided intermediate frequency signal and providing a second phase difference signal in response thereto; and generating the output frequency signal in response to the second phase difference signal.

20. The method of claim 19 which further comprises the steps of:

amplifying and filtering the first phase difference signal;

amplifying and filtering the first feedback signal;

amplifying and filtering the second phase difference signal; and amplifying and filtering the second feedback signal.

* * * * *